United States Patent
Buck et al.

(10) Patent No.: US 8,241,841 B2
(45) Date of Patent: Aug. 14, 2012

(54) PATTERNING METHODS AND PRODUCTS

(75) Inventors: Manfred Buck, Strathkinness (GB); Piotr Cyganik, Liszki (PL)

(73) Assignee: The University Court of the University of St. Andrews, St. Andrews, Fife (GB)

(*) Notice: Subject to any disclaimer, the term of this patent is extended or adjusted under 35 U.S.C. 154(b) by 1407 days.

(21) Appl. No.: 10/594,654

(22) PCT Filed: Mar. 24, 2005

(86) PCT No.: PCT/GB2005/001159
§ 371 (c)(1),
(2), (4) Date: Sep. 26, 2006

(87) PCT Pub. No.: WO2005/092516
PCT Pub. Date: Oct. 6, 2005

(65) Prior Publication Data
US 2007/0140901 A1 Jun. 21, 2007

(30) Foreign Application Priority Data
Mar. 26, 2004 (GB) .................... 0406841.7

(51) Int. Cl.
G03F 1/00 (2006.01)
G03F 7/16 (2006.01)
G03F 7/20 (2006.01)
G03F 7/26 (2006.01)

(52) U.S. Cl. ........ 430/330; 430/964; 430/311; 430/325; 430/326; 430/327; 430/328; 430/331; 430/269; 430/270.1; 430/275.1; 428/409; 428/543; 428/913

(58) Field of Classification Search .................. None
See application file for complete search history.

(56) References Cited

U.S. PATENT DOCUMENTS

| 2002/0192722 A1* | 12/2002 | Stolowitz et al. ............. 435/7.9 |
| 2003/0035967 A1 | 2/2003 | Effenberger |
| 2003/0081463 A1 | 5/2003 | Bocian et al. |
| 2003/0142901 A1* | 7/2003 | Lahann et al. ................. 385/18 |
| 2003/0170999 A1* | 9/2003 | Myerson ....................... 438/712 |

FOREIGN PATENT DOCUMENTS
EP 0 598 361 A 5/1994

OTHER PUBLICATIONS

Rozsnyai et al ("Selective Electrochemical Deposition of Polyaniline via Photopatterning of a Monolayer-Modified Substrate", Journal of American Chemical Society, 1994, 116(3), p. 5993-5994).*
Rong et al ("On the Importance of the Headgroup Substrate Bond in Thiol Monolayers: a Study of Biphenyl-Based Thiols on Gold and Silver", Langmuir, vol. 17, p. 1582-1593 (2001)).*
International Search Report for corres. PCT/GB2005/001159 completed Jun. 14, 2005 by M. Connor of the EPO.

* cited by examiner

Primary Examiner — Sin J. Lee
(74) Attorney, Agent, or Firm — Tarolli, Sundheim, Covell & Tummino LLP

(57) ABSTRACT

The present invention provides a process for producing a surface-modified layer system comprising a substrate (2) and a self-assembled monolayer (SAM) (1) anchored to its surface. The SAM (1) is comprised by aryl or rigid alicyclic moiety species. The process comprises providing a polymorphic SAM (1) anchored to the substrate (2), and thermally treating (4) the SAM to change from a first to a second structural form thereof. The invention also provides a thermolithographic form of process in which the thermal treatment (4) is used to transfer a pattern (3) to the SAM (1), which is then developed.

17 Claims, 4 Drawing Sheets

PATTERNING METHODS AND PRODUCTS

The present invention relates to methods and processes of patterning self-assembled mono-layers, and product obtainable by such processes.

There is considerable interest in the production of SAMs for various purposes. Recently there has been disclosed in WO 0123962 a surface-modified layer system in which a self-assembled monolayer (SAM) has been irradiated by various kinds of radiation selected from electron beam, plasma, X-Ray, β-Ray, γ-Ray and UV which results in cross-linking of the molecules of the SAM thereby forming a protective coating on the substrate which is resistant to damage caused by friction or corrosion.

The use of such types of highly energetic radiation which result in chemical change inevitably involve a degree of lack of control of the chemical reactions involved and can result in the incidence of undesired side-reactions, and/or the production of undesirable artifacts and by-products. Furthermore, electrochemical and electronic properties are inevitably changed upon irradiation of SAMs with energetic particles rendering for example, such SAMs electrically non-conducting or chemically inert. Another problem is that, in the case of radiation in the form of particles such as electrons, ions, plasma, special environments (e.g. vacuum) are required.

There is a need for improved and/or alternative techniques for production of stable SAMs, especially patterned SAMs. It is also an object of the invention to avoid or minimise one or more disadvantages of the prior art.

It has now been found that by selection of the compounds used to form the SAM, it is possible to obtain a polymorphic SAM which can be transformed from a first, less stable, structure, to a second, more stable, structure, by means of thermal treatment thereof. In more detail, it has been found that polymorphic SAMs can be obtained by using selected aryl moiety species in which at least two of the various factors affecting the energy balance in the SAM on the particular substrate used, are in competition with each other—in contrast to the normal practice employed in producing SAMs, where, in some cases, the compounds used in the SAMs are selected so as to minimise energy with all the various factors affecting the energy balance being used in collaboration with each other to maximise the stability of the SAM, or in other cases, no attention at all is paid to how different factors affect the energy balance. Furthermore it has been found that the, less stable, SAMs produced with such selected compounds in accordance with the present invention, can be thermally patterned to transfer an image to the SAM, in which the image is defined by areas with different structural forms. Still further it has been found that these different structural forms have different degrees of stability whereby such a "latent" image—defined "only" by differences in structural form, can be "developed" or "fixed" by means of suitable processing of one or other of the thermally treated and untreated parts of the SAM, for example, by exchange, or otherwise removal, of the less stable structural form-SAM, thereby resulting in a chemically, and/or structurally, and/or topographically defined pattern.

In one aspect the present invention provides a surface-modified layer system comprising a substrate having a surface and a self-assembled monolayer (SAM) anchored to at least part of said surface, wherein said SAM is comprised by an aryl moiety species in a substantially stable structural form derived, in situ, by thermal treatment from a less stable structural form.

The invention also provides a process for producing a surface-modified layer system comprising a substrate having a surface and a self-assembled mono-layer (SAM) anchored to at least part of said surface, wherein said SAM is comprised by an aryl moiety species, said surface comprising the steps of:
a) providing a SAM anchored to a substrate, wherein said SAM is polymorphic having at least first and second structural forms; and
b) thermally treating said SAM so as to change said SAM from said first structural form to said second structural form.

In another aspect the present invention provides a thermolithographic process comprising the steps of:
a) providing a SAM anchored to a substrate, wherein said SAM is polymorphic having at least first and second structural forms; and
b) transferring a desired pattern to said SAM using thermal treatment so as to change selectively part of said SAM from said first structural form to said second structural form.

In general said process also includes the further step of developing the thermally treated SAM by subjecting it to further processing so as to substantially modify selectively one of: thermally treated and non-thermally treated parts of the SAM.

In another aspect the invention provides a method of providing a surface-modified layer system comprising a SAM anchored to a substrate surface in a desired pattern thereon, which method comprises the steps of:
a) providing a substrate and a compound having a selected aryl moiety species and an anchor moiety bondable to said substrate so as to exert a directive force with respect to the molecular orientation, said selected aryl moiety species having a plurality of different parameters affecting the energy-balance of the SAM, wherein at least two of said parameters exert opposing directive forces arising from the molecule-substrate interaction which have a substantially competitive effect on said energy-balance which results in polymorphism of said SAM;
b) bonding of said compound to said substrate; and
c) subjecting said SAM to thermal treatment so as to change the energy-balance of said SAM in the thermally treated area so that said SAM is coverted into a different structural form, preferably a more stable form.

In a preferred form of the invention, there is used a thermal treatment applied selectively to only part of the SAM in accordance with a negative image of said desired pattern so that the thermally treated areas are rendered more stable compared to the untreated ones.

Thus by means of the present invention it is possible to provide to produce patterned SAMs in a novel manner which differs from previously known processes. Further surprising and unexpected features of the invention include inter alia, the significantly increased structural perfection of the thermally treated SAM with significantly increased domain size and resistance to structural disruption by surface discontinuities in the substrate surface.

The present invention can be used with a wide range of substrates and compounds. Suitable substrates generally comprise conductors or semiconductors such as gold, silver, chromium, manganese, vanadium, tungsten, molybdenum, zirconium, titanium, platinum, aluminium, iron, steel, indiumphosphide, gallium arsenide, and alloys and oxides, including glasses such as silicates and borates, as well as mixtures of such materials.

Suitable compounds generally comprise an anchor moiety, and a rigid moiety, generally an optionally substituted, aryl (including hetero-aryl) or rigid alicyclic moieties, and optionally a spacer moiety between the anchor moiety and the aryl or alicyclic moiety. Suitable anchor moieties include thio, seleno, carboxyl, phosphonate, phosphate and hydroxyl.

Suitable aryl moieties include phenyl, biphenyl and terphenyl, as well as fused ring systems such as anthracyl and naphthyl, and hetero-aryl groups such as bipyridyl, terpyridyl, thiophenyl, bithienyl, terthienyl and pyrrolyl and suitable rigid alicyclic moieties include bridged alicyclic systems such as bi-, tri-, or tetra-cycloalkanes. Optional substituents include halogen, carboxy, trifluoromethyl, thiol, hydroxy, cyano, amino, nitro, lower alkyl e.g. C1 to C6 and carbonyl. The use of such substituents can be useful in modifying the properties of the SAM in generally known manner. Thus, for example, non-polar substituents such as $CH_3$ can be used to make the SAM surface more hydrophobic, and polar substituents such as OH or COOH can be used to make the SAM surface more hydrophilic.

Suitable spacer groups include low molecular weight, saturated or unsaturated hydrocarbon chains and/or other structures containing e.g. ether linkages, amide groups, or even e.g. cycloalkyl cyclic structures. The spacer groups are preferably C1 to C10, advantageously C1 to C10 alkyl, most preferably C1 to C6. As further discussed hereinbelow, a number of factors affects the energy balance of the SAM and it is necessary that at least two of these factors enter the energy balance in a competitive way. There is a directive force originating from the SAM molecule-substrate interface, i.e. the substrate-head group bonding geometry favours a certain orientation of the molecule. (For the avoidance of doubt, it should be noted that the term "head group" is used herein to indicate the anchor moiety of the SAM molecule which is bound to the substrate, the other end being referred to as the "tail group"). A further important factor is the intermolecular interaction between neighbouring SAM molecules which is maximized in particular orientations of the SAM molecules. Design of the molecular structure is generally effected in such a way that the two competing factors cannot be maximized at the same time whereby the resulting SAM film structure represents a compromise between the competing factors which, therefore, results in pronounced local minima on the energy hypersurface of the system. As a consequence structural transitions between different (meta)stable structures and associated changes in properties are possible.

Additional factors entering the energy balance to a greater or lesser extent are the strength of the head group-substrate interaction, the head group-substrate corrugation potential (variation of the SAM molecule—substrate interaction across the substrate surface), possible reconstructions of the substrate surface at the head group-substrate interface, interactions between the SAM and its environment, and/or conformational degrees of freedom of the adsorbed molecules.

The molecular structure generally should match the substrate, e.g. for thiols on gold an even number of carbon atoms in the hydrocarbon spacer group between the head group and the aryl moiety, is required (C2, C4, C6, C8, C10) due to an $sp^3$-like bonding geometry of the substrate-sulphur-carbon bond angle whereas on silver an odd number (C1, C3, C5, C7, C9) produces the corresponding structure due to an $sp^3$-like bonding geometry of the substrate-sulphur-carbon bond angle. Care should be taken to avoid situations in which one of the factors dominates too strongly, e.g. if the intermolecular interactions dominates excessively the substrate-head group bonding geometry, then the SAM will not be able to transform under thermal treatment in accordance with the present invention. Thus, if for example, in the case of SAM molecules comprising unsubstituted biphenyl moieties, the length of the alkane spacer group might be limited to less than ten carbon atoms since otherwise the intermolecular interactions start to dominate excessively the substrate-head group bonding geometry.

One preferred group of compounds suitable for use as the SAM compounds of the present invention are 4-(4'-Methyl-biphenyl-4-yl)-alkane-1-thiols, especially the C1 to C10 (alkane) compounds. These are conveniently referred to as BPn where n is the number of carbon atoms in the alkane moiety, thus BP4 corresponds to 4-(4'-Methyl-biphenyl-4-yl)-butane-1-thiol.

The SAMs obtained using such selected compounds may be heat treated in various different ways. Thus they may be heated by means of direct contact with a heated body including thermal nanolithography with a microscopic heated tip tool), or a heated fluid (liquid or gas). Thermal treatment may also be effected remotely by means of electromagnetic radiation including infrared, visible, and ultraviolet laser radiation, which are generally easier to control. Such radiation may be continuous or pulsed, the latter being preferred in order to avoid loss of resolution in the image transfer process due to heating of areas adjacent to those being heated directly, as a result of thermal conduction from the latter to the former, resulting in unintentional heating of the former. Pulsed laser and other radiation can be particularly convenient in view of the various different irradiation parameters (pulse profile including height (energy) and duration, as well as duration of inter-pulse interval) which can be more or less readily controlled.

It will be appreciated that the treatment temperatures required for different SAMs and/or different SAM-substrate combinations, may differ to some extent. In general, though, we have found that the SAM should be raised to a temperature of at least around 100 to 140° C. On the other hand excessively high temperatures should be avoided as these may result in disruption of the physical structure, and/or chemical degradation of the SAM compounds, or simply formation of yet other structural forms which are undesirable, e.g. because they are less stable and/or less resistant to exchange. In general, though, the treatment conditions used will involve a balance between factors such as temperature, treatment time, treatment mode (e.g. pulsed or continuous irradiation), and desired resolution).

In order to protect the SAM against chemical degradation and/or contamination it is desirable, to use a substantially inert environment. Thus the heat treatment may be carried out under vacuum, or a noble gas, such as Argon, a relatively inert gas such as nitrogen or an inert liquid such as an alcohol or decalin.

The duration of the thermal treatment (not including the interruptions in the case of pulsed mode treatments), can also be varied and will moreover depend to a greater or lesser extent on the treatment temperature used. In general, higher temperatures reduce the time of treatment and typical values for a biphenyl thiol SAM are 150° C. and 15 hrs for continuous (non-pulsed) treatment. Insofar as the change in crystalline structure and/or packing density can be readily monitored by means of scanning probe microscopies, ellipsometry, vibrational spectroscopy (applicable in situ), and/or ex situ by structurally sensitive surface analysis methods or contact angle measurement (the latter after a suitable development process), it will be appreciated that suitable thermal treatment times for any given case can be readily determined by trial and error. By way of illustration we have found that the required structural form change can be achieved for a BP4 (4-(4'-Methyl-biphenyl-4-yl)-butane-1-thiol) SAM on gold using continuous thermal treatment of several hours, and with laser irradiation shorter than 1 hour, without significant degradation or chemical change in the SAM.

As noted above, various kinds of thermal treatment may be used in accordance with the present invention. Besides non-patterned treatment (where the whole SAM is treated uniformly), patterns can be generated by serial and parallel methods. Suitable types of treatment include contact methods (oven/hot plate for uniform treatment, and heated mask or tip in thermal contact with the SAM for patterned treatment) and contactless treatment (radiation, laser etc). For parallel processing (where the desired image is transferred simultaneously by exposure of the SAM through a suitable mask), a laser or any other light source of sufficient power is preferably used. A principal advantage of parallel processing (irradiation through a mask or a mask in thermal contact with sample) is the speed with which the image can be transferred.

In some cases, though, where it is desired to increase resolution, serial processing (where the different parts of the image are transferred successively by "writing" them with a scanning beam or a point probe in thermal contact with the sample), may be preferred. In this case there may be used a focused laser beam, a scanning near field optical tip or a heated tip. In this case it will be appreciated that the scanning speed may be used to control the degree of thermal treatment applied to the SAM. Moreover, by varying the scanning speed, different parts of the image being transferred, may be subjected to different levels of thermal energy in a relatively simple and easily controlled manner.

Once an image has been thermally transferred to the SAM, it may be "fixed" or "developed", by making use of the difference in properties between the original, untreated, SAM structure, and the new SAM structure produced by the thermal treatment. A principal difference is that the thermally treated structure is more resistant to exchange of the anchored compounds of the SAM with other molecules, e.g. SAM forming thiols of various lengths, typically C4 to C20, for example, ω-mercaptohexadecanoic acid (MHA) or ω-mercaptoundecanoic acid). Such exchange will result in removal of the non-thermally treated, less stable structural form, and formation of an adsorbate layer of the respective molecule. In general such replacement is carried out in solution, i.e. the thermally treated SAM is exposed to a solution which contains the displacing molecules.

The patterned SAMs provided by the present invention may be used for various different purposes involving greater or lesser degrees of further processing. The patterned SAMs will generally be developed or fixed in some way, for example, by using differences in the structure to treat the underlying substrate (e.g. wet chemical etching) or to control electrochemical processes, by modification of the SAM itself (e.g. particle or photon irradiation,) or by displacement of the less stable parts via exchange with other molecules. Such developed/fixed patterned SAMs can be used directly for, inter alia, controlling wetting properties, electrode properties (conducting vs insulating, spatially defined change of work function), electrochemical, and/or tribological properties.

The patterned SAMs can also be used in conjunction with further processing of the substrate and/or to build additional material layers etc. Thus, for example, the patterned SAM can be used as a lithographic mask for processing of the substrate, for example, by chemical and/or physical etching of those parts of the substrate with non-thermally treated SAM. Furthermore, the "patterned" (without further processing) or "fixed" (after exchange of non treated areas by other molecules or other treatment) SAM can be used as template to direct and confine electrochemical, chemical or physical processes (e.g. metal deposition by using a combination of conductive and blocking molecules, selective grafting of other molecules by using a combination of molecules bearing chemically or electrochemically active/passive end groups, or switching of surface properties by light induced isomerization of molecular entities).

Further preferred features and advantages of the invention will appear from the following Examples and Figures provided by way of illustration. In the Figures.

EXAMPLE 1

Preparation of Patterned SAM

A—Preparation of SAM

Figure 1:
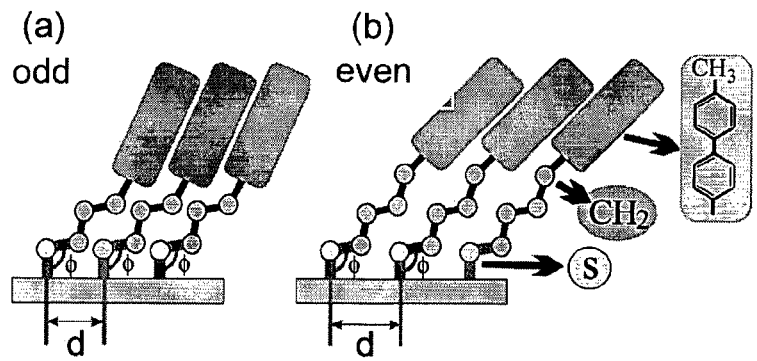
FIG. 1 is a schematic cross-sectional view showing the effect of the spacer chain length on the arrangement of the anchored compound in the SAM.

BP4 (4-(4'-Methyl-biphenyl-4-yl)-butane-1-thiol) was prepared as described in Rong et al, Langmuir 17, 1582 (2001). A BP4 SAM was then prepared at room temperature by immersion of a gold substrate (polycrystalline gold (111) film (300 nm thick evaporated at 2 nm/s onto mica at 340° C. and flame annealed in an oxygen flame) into a solution of BP4 (10 micromolar) in ethanol for typically 24 h. Subsequently, the coated substrate specimen was rinsed with ethanol and blown dry with nitrogen or argon. FIG. 1(b) shows schematically the BP4 SAM obtained and FIG. 1(a) shows for comparison an analogous BP3 SAM.

B—Thermal Treatment of SAM

Figure 2:
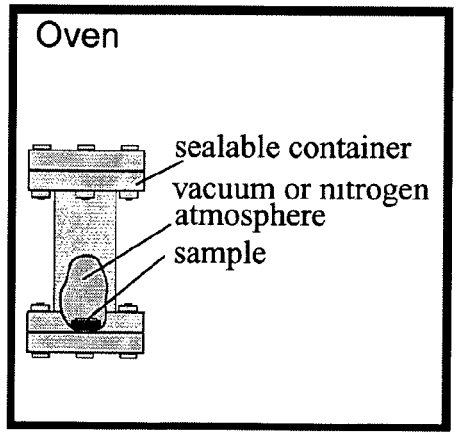
FIG. 2 is a schematic illustration of a thermal treatment processing apparatus.

The SAM was heated in a closed container (as illustrated in FIG. 2) which was filled with nitrogen at 150° C. for 15 hrs.

C—Structural Properties of Patterned SAM

Figure 3:
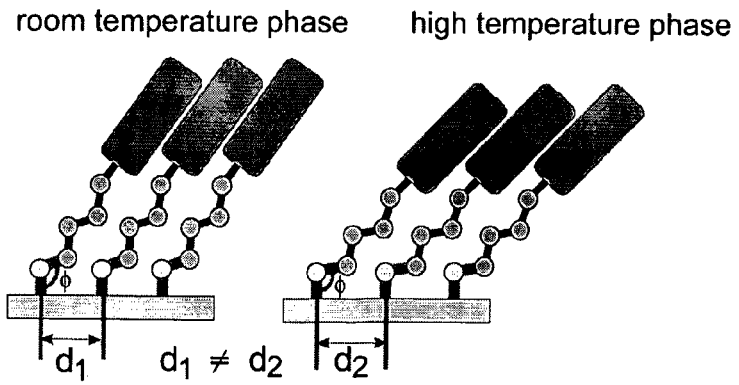
FIG. 3 is a view corresponding to FIG. 1b showing change of some of the anchored compound following thermal treatment.
Figure 4:
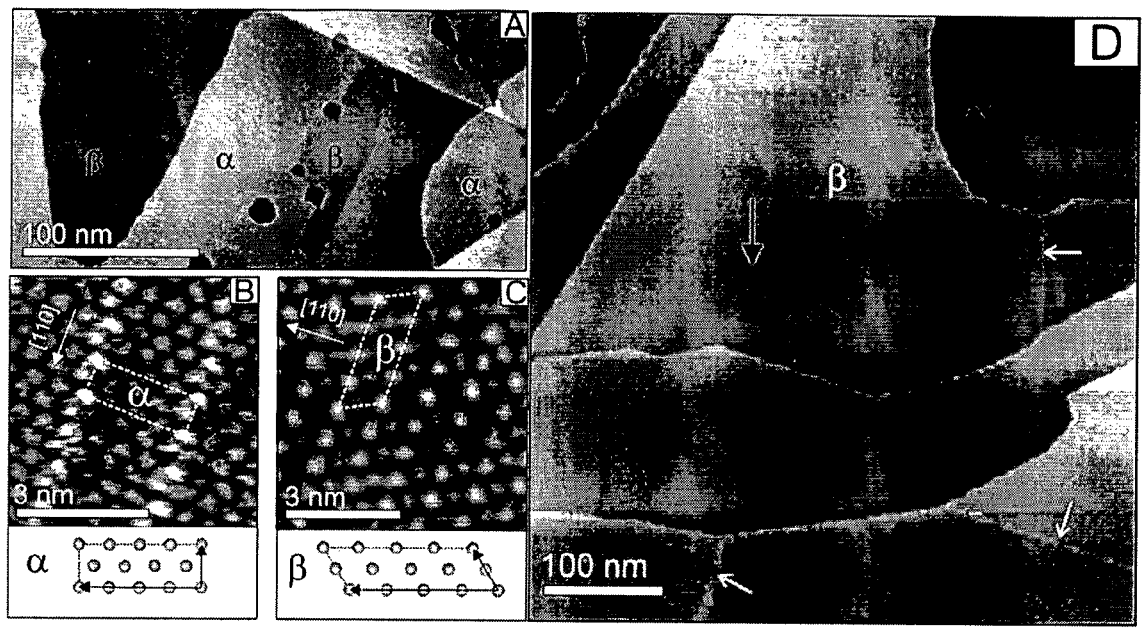
FIG. 4 shows STM and optical microscopy images of different structural forms of BP4 SAMs.

Thermally treated and non-treated areas of the BP4 SAM differ both in molecular density and structural perfection. The non-treated structure adopts a ($5\sqrt{3}\times3$) structure with an area of 27 Å$^2$ per molecule (α phase) whereas the annealed structure adopts a ($6\sqrt{3}\times2\sqrt{3}$) structure and an area of 32.4 Å$^2$ per molecule (βphase). With domain sizes of the β-phase easily exceeding $10^5$ nm$^2$ compared to typically <$10^3$ nm$^2$ of the (α-phase the structural perfections of the SAM is dramatically improved upon annealing. The thermally treated and non-treated BP4 SAM areas are also compared schematically in FIG. 3.

FIG. 4A-D shows scanning tunneling microscope images of BP4 SAM on a gold substrate: (A) is a large scale image showing phase α (bright areas) and β phase (darker areas) coexisting. (B),(C) are more detailed molecular resolved images showing molecular packing and illustration of the unit cell. Each spot represent a molecule. Differences in brightness correspond to differences in tunneling current. The sample shown in (A) displays random patterning obtained by incomplete thermal treatment (at a sub-optimal treatment temperature) whereas the sample shown in (D) shows complete transformation from α to β phase. White arrows indicate domain boundaries, and black arrows indicate monoatomic steps in the gold substrate.

EXAMPLE 2

"Fixing" of Patterned SAM

Figure 5:
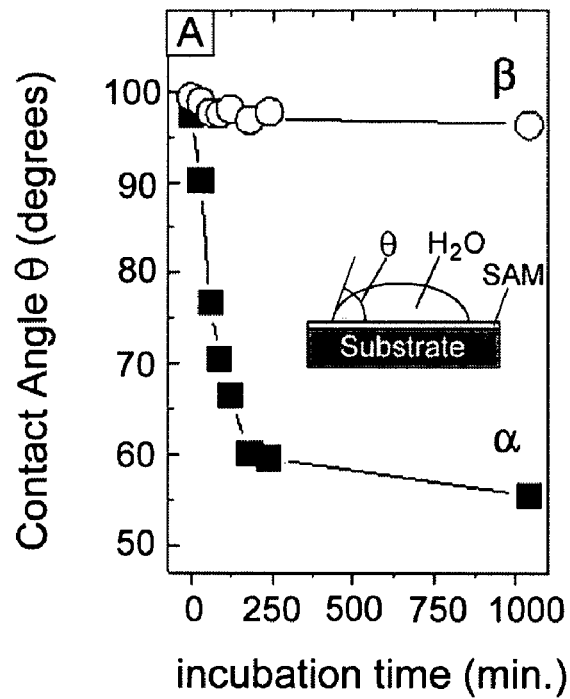
FIG. 5 shows a graph of the difference in change of contact angle following exchange treatment with MHA of different BP4 SAM structural forms.
Figure 6:
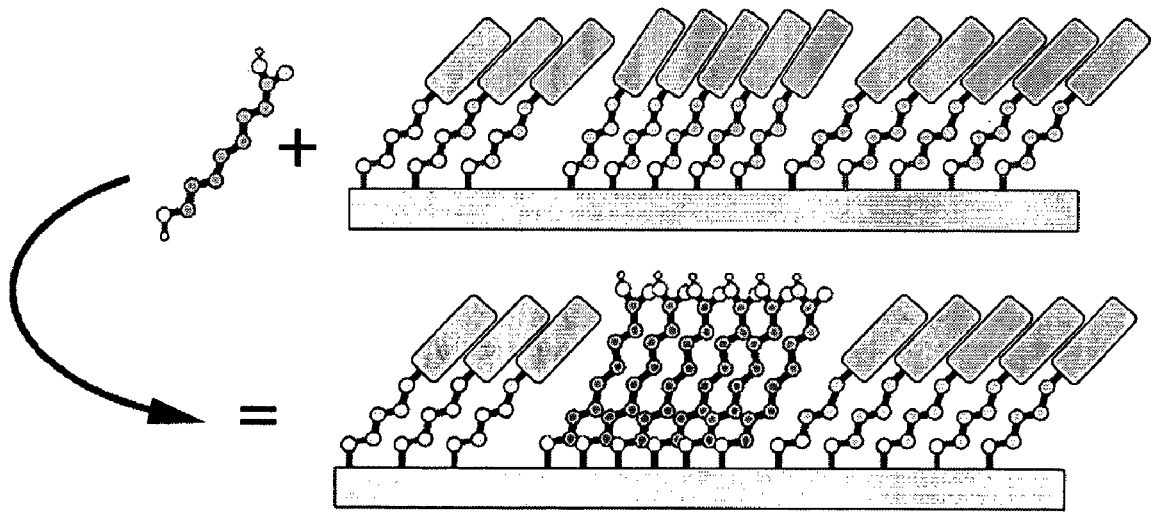
FIG. 6 is a view corresponding to FIG. 3 showing "fixing" of the patterned SAM of FIG. 3 by exchange treatment.
Figure 7A:
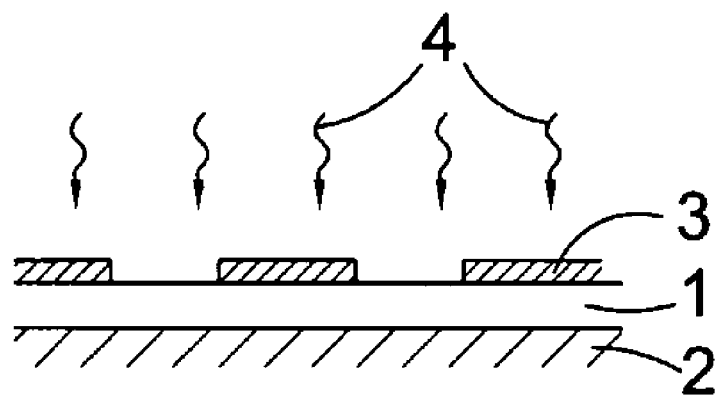
FIGS. 7A and 7B illustrate schematically, different patterning arrangements.
Figure 7B:
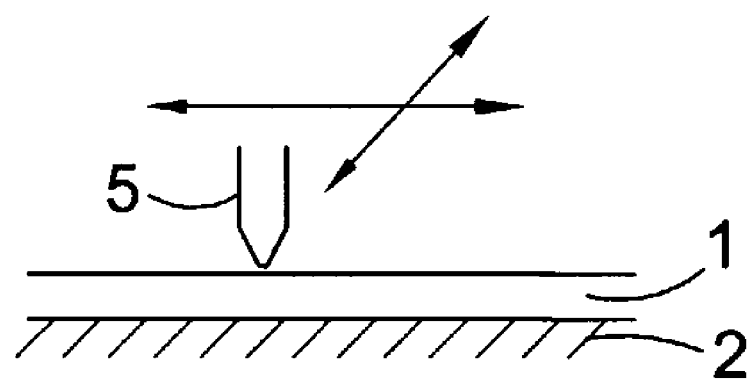

The thermally treated SAM obtained in Example 1, was immersed in a 1 mM solution of ω-mercaptohexadecanoic acid (MHA) in ethanol for differed periods of time (from 5 minutes to more than 30 days) at ambient temperature. As may be seen in the upper curve in FIG. 5, even after 4 hours treatment with MHA there is little more than 5% change in contact time, indicating very little exchange of the SAM. In contrast, treatment of a corresponding non-thermally treated SAM with MHA, results in a large change of some 40% in contact angle indicating a high rate of exchange of SAM compound with MHA. FIG. 6 illustrates schematically the replacement of thermally non-treated BP4 SAM areas with MHA. FIG. 7A illustrates selective thermal treatment of a SAM layer 1 on a gold substrate 2 by irradiation with laser radiation 4 through a mask 3. FIG. 7B shows a SAM layer 1 on a gold substrate 2, being selectively thermally treated by means of a 2D scanning microscopic heated tip tool 5.

Figure 8:
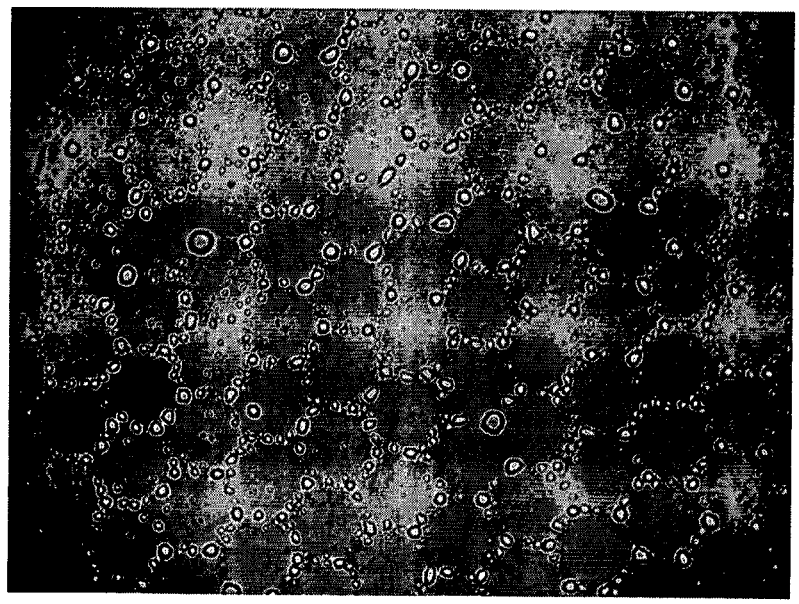
FIG. 8 shows an optical microscopy image of a developed BP4 SAM.

FIG. 8 is an optical microscope image, showing a condensation pattern on top of a BP4 SAM on gold, in which a pattern has been "developed" by immersion in mercaptohexadecanoic acid (MHA). Since MHA is significantly more hydrophilic than BP4, water condenses preferentially on those areas (the hexagons) occupied by MHA in place of the BP4 molecules. The size of the hexagons is about 60 μm.

The invention claimed is:

1. A thermo-lithographic process using a surface-modified layer system comprising a substrate having a surface and a self-assembled monolayer (SAM) anchored to at least part of said surface, wherein said SAM is comprised by aryl or rigid alicyclic moiety species, said process comprising the steps of:
    a) providing said SAM anchored to a substrate, wherein said SAM is polymorphic having at least first and second structural forms; and
    b) thermally treating said SAM in a desired pattern so as to change selectively part of said SAM from said first structural form to said second structural form.

2. A process according to claim 1, which process includes the preliminary steps of:
    a) providing a said substrate and a compound having a selected said aryl or rigid alicyclic moiety species and an anchor moiety bondable to said substrate so as to exert a directive force with respect to the molecular orientation of said compound, said selected aryl moiety species having a plurality of different parameters affecting the energy-balance of the SAM, wherein at least two of said parameters exert opposing directive forces arising from the molecule-substrate interaction which have a substantially competitive effect on said energy-balance which results in polymorphism of said SAM; and
    b) bonding of said compound to said substrate.

3. A process according to claim 1 wherein said thermal treatment is selectively to only part of the SAM in accordance with a negative image of said desired pattern so that the thermally treated areas are rendered more stable compared to the untreated ones.

4. A process according to claim 1 wherein said thermal treatment is selected from: direct contact with a heated body or a heated fluid; and exposure to thermal radiation.

5. A process according to claim 4 wherein said radiation is pulsed.

6. A process according to claim 1 wherein said SAM is raised to a temperature of at least 100° C.

7. A process according to claim 1 wherein the thermal treatment is carried out in a substantially inert environment.

8. A process according to claim 1 wherein said thermal treatment is formed and arranged for parallel-form pattern transfer.

9. A process according to claim 1 wherein said thermal treatment is formed and arranged for serial-form pattern transfer.

10. A process according to claim 1, which process includes the further step of developing the thermally treated SAM by subjecting it to further processing so as to substantially modify selectively one of: thermally treated and non-thermally treated parts of the SAM.

11. A surface-modified layer system comprising a substrate having a surface and a heat treated self-assembled monolayer (SAM) anchored to at least part of said surface, wherein said SAM is comprised by an aryl or rigid alicyclic moiety species, the SAM having a first less stable structural form prior to heat treatment and a second more stable structural form after heat treatment, wherein said second more stable structural form further comprises domain sizes that exceed $10^5$ square nanometers ($nm^2$).

12. A surface-modified layer system comprising a substrate having a surface and a self-assembled monolayer (SAM) anchored to at least part of said surface, wherein said SAM is comprised by a aryl or rigid alicyclic moiety species in a substantially stable structural form derived, in situ, by thermal treatment from a less stable structural form, wherein said SAM is comprised by a compound which comprises an anchor moiety, and an optionally substituted, aryl (including hetero-aryl) moiety and which includes a spacer moiety between the anchor moiety and the aryl moiety, wherein said aryl moiety is a polycyclic aryl, and wherein said substrate comprises gold, said anchor moiety comprises thiol, and the spacer group is selected from C2, C4, C6, C8, and C10, alkyl.

13. A system according to claim 12 wherein said aryl moiety comprises at least one of biphenyl, terphenyl, anthracyl, naphthyl, bipyridyl, terpyridyl, bithienyl or terthienyl.

14. A surface-modified layer system comprising a substrate having a surface and a self-assembled monolayer (SAM) anchored to at least part of said surface, wherein said SAM is comprised by a aryl or rigid alicyclic moiety species in a substantially stable structural form derived, in situ, by thermal treatment from a less stable structural form, wherein said SAM is comprised by a compound which comprises an anchor moiety, and an optionally substituted, aryl (including hetero-aryl) moiety and which includes a spacer moiety between the anchor moiety and the aryl moiety, wherein said aryl moiety is a polycyclic aryl, and wherein said substrate comprises silver, said anchor moiety comprises thiol, and the spacer group is selected from C1, C3, C5, C7, and C9, alkyl.

15. A system according to claim 14 wherein said aryl moiety comprises at least one of biphenyl, terphenyl, anthracyl, naphthyl, bipyridyl, terpyridyl, bithienyl or terthienyl.

16. A surface-modified layer system comprising a substrate having a surface and a self-assembled monolayer (SAM) anchored to at least part of said surface, wherein said SAM is comprised by a aryl or rigid alicyclic moiety species in a substantially stable structural form derived, in situ, by thermal treatment from a less stable structural form, wherein said SAM is a 4-(4'-Methyl-biphenyl-4-yl)-alkane-1-thiol.

17. A system according to claim 16 wherein said alkane is C1 to C10 alkane.

* * * * *